(12) United States Patent
Ventomäki

(10) Patent No.: US 7,211,995 B2
(45) Date of Patent: May 1, 2007

(54) METHOD AND SYSTEM FOR DETECTING ELECTRONIC COMPONENT FAILURES

(75) Inventor: Hannu Ventomäki, Salo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/814,855

(22) Filed: Mar. 30, 2004

(65) Prior Publication Data
US 2005/0218883 A1 Oct. 6, 2005

(51) Int. Cl.
*G01R 31/02* (2006.01)
(52) U.S. Cl. .................... 324/158.1; 324/538
(58) Field of Classification Search ........... 324/755, 324/754, 765, 158.1, 757
See application file for complete search history.

(56) References Cited

U.S. PATENT DOCUMENTS 5,712,570 A * 1/1998 Heo et al. .................... 324/538
5,966,020 A * 10/1999 Rampone et al. ............ 324/755
2004/0257090 A1* 12/2004 Barr et al. .................... 324/537

* cited by examiner

*Primary Examiner*—Ernest Karlsen
(74) *Attorney, Agent, or Firm*—Alfred Fressola; Ware, Fressola, Van Der Sluys & Adolphson LLP

(57) ABSTRACT

The invention relates to a method for analysing connection conditions between an integrated circuit package and a circuit board, wherein said integrated circuit package is electrically coupled to said circuit board by coupling elements, and therein said integrated circuit package is mechanically connected with said circuit board by support elements. To allow easy failure analysis, it is proposed that physical values are picked-off from said support elements, and said physical values are evaluated to determine the condition of said connection between said integrated circuit package and said circuit board.

19 Claims, 3 Drawing Sheets

METHOD AND SYSTEM FOR DETECTING ELECTRONIC COMPONENT FAILURES

FIELD OF THE INVENTION

The invention relates to a method for analysing connection conditions between an integrated circuit package and a circuit board, wherein said integrated circuit package is electrically coupled to said circuit board by coupling elements, and wherein said integrated circuit package is mechanically connected with said circuit board by support elements.

The invention also relates to a system for analysing connection conditions between an integrated circuit package and a circuit board, comprising coupling elements coupling said integrated circuit package electrically to said circuit board, and support elements connecting said integrated circuit package mechanically with said circuit board.

Further, the invention relates to a consumer electronic device, in particular a mobile phone, comprising such a system.

The invention further relates to a computer program and a computer program product for analysing connection conditions between an integrated circuit package and a circuit board.

BACKGROUND OF THE INVENTION

Electronic products are subject to miniaturising. Therefore, electronic components of these products need to be ever smaller and lighter. As a result, more and more integrated and high integrated circuits are required within even smaller packages. Connection pins in former dual-in-line (DIL) packages have been produced with 2,54 mm masks. Quad Flat Packages (QFP) were provided with 0,5 mm masks.

Reducing the sizes of the masks and increasing the number of connection pins generated the need for new designs, such as pin grid arrays (PGA) and ball grid arrays (BGA). The particulars of these designs are that they provide their connection pins throughout the whole array surface, rather than just on its periphery, as was the case with former designs.

To further reduce the size of the packages, it has been proposed to use flip chip technology and chip scale/size packages (CSP). Chip size packages are characterized in that the area of the package may not be larger than the die itself. For chip scale packages, the area of the package may not be larger than 1.2 times the size of the die.

CSPs being mounted on a carrier substrate and being connected to the substrate by bonding require complicated processing steps.

In particular ball grid arrays and CSPs are subject to significant failures in electronic components. These failures, which may be a consequence of a shock impacted from drop and fatigue from thermal and bending cycling, also apply to any other type of packages, interconnections and connection types, such as soldering and glueing. The packages fail mainly due to failure in the interconnection between the component and the printed wiring board, in particular in the solder joints or in the printed wiring board (PWB) build-up.

As failures within the electrical coupling elements are the reason for most of the malfunctions of electronic components and devices, there is a need to determine the components where the failure occurred. To allow easy, fast and inexpensive repair of electronic devices, it is required to find the components which are subject to broken coupling elements quickly. The lack of knowledge of broken components requires intensive laboratory analysis and long service time for end users, in case the equipment malfunctions. Current failure mode analysis is based on try and error methods. As the failure usually cannot be located exactly, often more components are replaced than necessary.

SUMMARY OF THE INVENTION

To overcome these drawbacks, the invention proposes a method wherein physical values are picked-off from said support elements, and said physical values are evaluated to determine the condition of said connection between said integrated circuit package and said circuit board.

By picking-off physical values from support elements, which mount the integrated circuit package on a printed circuit board, it may be possible to detect components with broken electrical or mechanical couplings between the integrated circuit and the circuit board. As each integrated circuit package, such as a CSP, has to be mounted by support elements onto a wiring board, as a PWB, the support elements may be subject to a further use, such as failure analysis. It has been observed that the functionality of the electrical connection between the PWB and the CSP is in close relation to the mechanical coupling of the components, i.e. in case the mechanical coupling is broken, in most cases the electrical connection also malfunctions.

Therefore, the invention proposes to analyze the support elements by picking-off physical values and to determine the state of the mechanical coupling from these physical values. The state of the mechanical coupling may then be used to determine the state and condition of the electrical coupling, as, as previously stated, the electrical and mechanical functionality are in close relation.

Therefore, the use of the mechanical couplings to determine the state of the electrical or mechanical coupling enables to determine broken connections and allows easy and fast failure analysis. The broken elements may thus be found quickly and exchange is only necessary for these components.

The failure analysis is therefore based on facts about the condition of the connection between the integrated circuit and the PWB, and trial and error analysis is obsolete.

By connecting the support elements for analysing components, and by analysing the picked-off physical values, information about possible mechanical disconnections between the support elements and the integrated circuit caused by mechanical stress (drop, thermal stress, shock, etc.) becomes available. This information may further be used to determine electrical disconnections and thus to find packages causing malfunctions easily.

According to a preferred embodiment, electrical values are picked-off from said support elements. Mechanical conditions may often be determined from electrical properties of components. Therefore, it may be possible to determine the mechanical condition of said support elements by picking-off electrical values and analyze these. It is therefore preferred that electrical resistance and/or electrical current and/or voltage within said support elements is picked-off. These electrical values allow determining the mechanical status of the support element. In particular one tap is positioned at the integrated circuit package side of the support element and a second tap is positioned at the PWB side of the support element. Between these taps, a current, a voltage and/or a resistance may be measured. From these measured values the mechanical condition of the component may be determined (i.e. the higher the resistance, the weaker the mechanical connection).

It is also preferred that mechanical values are picked-off from said support elements. These may preferably be picked-off from said support elements using a strain gauge. Thus the mechanical stress of the support element may be determined directly, thus enabling determination of the condition of the mechanical connection.

As the mechanical condition and the electrical condition are in close relation, it is proposed that a condition of said electrical coupling of said integrated circuit package with said circuit board is concluded from said determined condition of said connection.

To provide constant information about a connection condition, it is proposed to determine said connection condition in intervals. Thus, error in said connection may be determined contemporary.

To provide a log-file comprising information about connection conditions, it is preferred that said determined connection conditions are stored.

Providing information about malfunctioning connections, it is proposed that in case a poor connection condition is determined, an error message is generated. Said error message may be stored within storage means, or sent to any recipient within the device or outside the device to allow maintenance of the device and to allow exchanging the corrupt component.

To provide a user of an electronic device, such as a mobile phone, with information about failures in the device, it is proposed that said error message is presented on a user interface. The user may thus be prompted to contact a local authorized workshop for needed actions. The user may also receive a message about a mechanical shock of certain components, even before the device itself is broken. The error message may also be used to determine the broken component and to shorten failure analysis.

Information about mechanical shocks or broken components for future needs may also be necessary. Therefore, it is preferred that said error message is stored. The storage may be understood as a log-file comprising information about the status of each component at any time. Therefore, it is also proposed that said error message is read out from a storage and used for maintenance.

Another aspect of the invention is a system for analysing connection conditions between an integrated circuit package and a circuit board, comprising coupling elements coupling said integrated circuit package electrically to said circuit board, and support elements connecting said integrated circuit package mechanically with said circuit board, characterized by measuring means arranged at said support elements to pick-off physical values from said support elements, and evaluation means evaluating said physical values to determine the condition of said connection between said integrated circuit package and said circuit board.

To provide good information about the mechanical status of the connection between the integrated circuit and the circuit board, it is proposed that said support elements are arranged between said circuit board and said integrated circuit package. This ensures on the one hand good mechanical connection between the IC and PWB and on the other hand, allows easy access to mechanical conditions of the connection.

Good connecting properties and also easy picking-off of electrical properties of the support elements are possible in case said support elements are solder pads. These provide good mechanical properties with respect to coupling the IC on the PWB. This also provides good electrical properties being used when picking-off the physical values for determination of the mechanical condition of the connection.

To provide a close relationship between the mechanical condition of the support elements and the electrical condition of the coupling elements, it is preferred to arrange said support elements adjacent to said coupling elements. It has been detected that arranging said support elements semicircular along said coupling elements provides good results. This is because this arrangement may detect any mechanical stress on the support elements (i.e. shear forces, torque, tensile force, pulling force, . . . ). According to another embodiment, also providing good results in terms of detecting mechanical stress, it is proposed that said support elements are arranged along edges and/or at corners of said integrated circuit package.

To provide high integration of integrated circuits and to provide good failure analysis, it is proposed that said integrated circuit package is a chip scale package or a chips size package.

Measuring physical values is preferably done by providing said measuring means which pick-off electrical conditions of said support elements. However, it is also proposed that said measuring means provide picking-off mechanical conditions of said support elements.

To allow storage of measured results to enable to reconstruct failures, it is proposed that storage means are comprised to store said picked-off physical values.

Determination of the condition of said support elements requires comparative values. Therefore, it is proposed that said evaluation means compare said picked-off physical values with comparative values to determine connection condition.

To inform about malfunctions, said evaluation means provide an error message in case a poor connection condition is determined. This error message may be used to inform users of the malfunction.

In case the device is repaired, it might be helpful to know when the error occurred. Therefore, said error message is stored within said storage means, according to a preferred embodiment.

Providing an interface to read out said stored physical values and/or stored error messages, allows technicians to retrieve information about the failure and to replace only the elements which are broken.

Another aspect of the invention is a consumer electronic device, in particular a mobile phone, comprising a system as previously described.

A further aspect of the invention is a computer program operable to cause a processor to analyze connection conditions between an integrated circuit package and a circuit board according to a method as previously described.

Eventually, another aspect of the invention is a computer program product comprising such computer program operable to cause a processor to analyze connection conditions between an integrated circuit package and a circuit board according to a previously described method.

The invention will be described in more details with reference to the following figures.

BRIEF DESCRIPTION OF THE FIGURES

The figures show.

DETAILED DESCRIPTION

Figure 1:
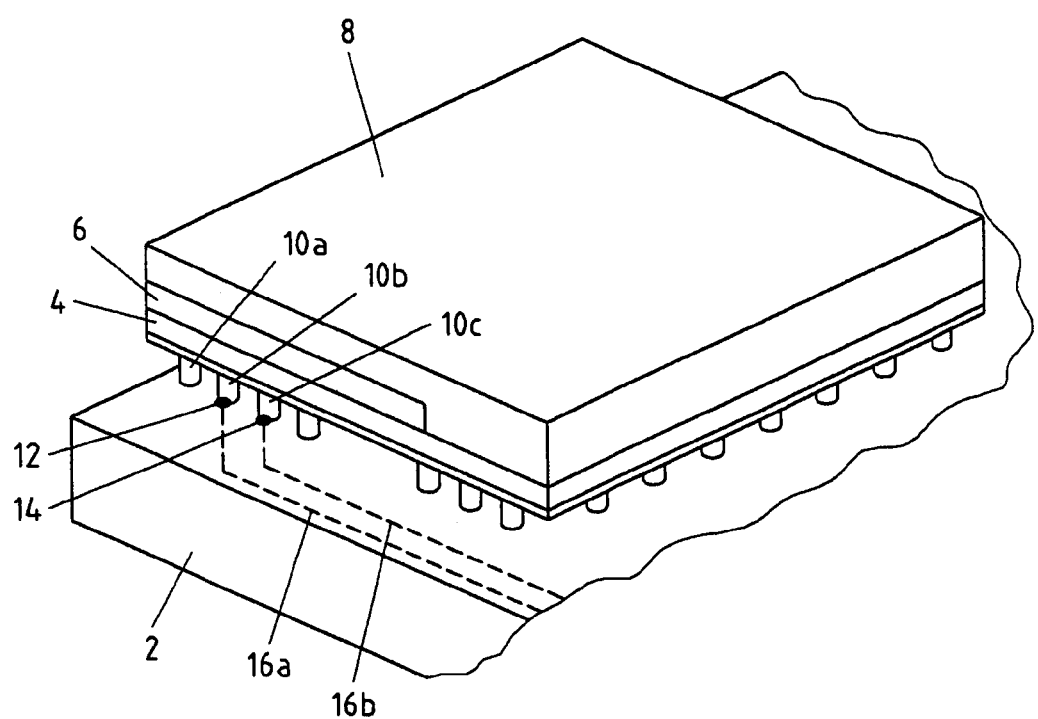
FIG. 1 a sectional view of an inventive assembly.

Table 1 identifies the reference numerals used in the specification and drawings.

FIG. 1 depicts a sectional view of an inventive assembly. An integrated circuit package comprising a substrate 4, a die 6 and, a mold 8 is mounted on a printed wiring board 2.

The integrated circuit package is mechanically coupled to the printed wiring board 2 by support elements 10, such as solder balls. Electrically, the integrated circuit package is connected to the printed wiring board 2 by a ball grid array (not depicted).

To enable determining the status of the mechanical connection between the printed wiring board 2 and the integrated circuit package, it is proposed to pick-off electrical values from the support elements 10.

As depicted in FIG. 1, support element 10b has a tap 12, which is connected to connection wire 16a. Support element 10c has a tap 14, being electrically coupled to wire 16b. Support element 10b is electrically connected to support element 10c on the side of said substrate 4 (not depicted). Therefore, the support element 10b provides a short circuit with support element 10c.

To enable detecting mechanical properties of said support elements 10, the electrical resistance between the taps 12, 14 is measured by a measuring device (not depicted) connected to wires 16a, 16b. The resistance in case of a faultless connection is close to zero, as the taps 12, 14 are short-circuited.

However, in case mechanical stress is applied to the printed wiring board 2, or the integrated circuit package, the support elements 10 may be subject to mechanical deformation. Mechanical deformation of the support elements 10, however, causes a change in their electrical properties. As a result, the resistance between the taps 12, 14 changes, which may be detected by the measuring device. This change in resistance may be analyzed and a failure within the component may be determined. However, a change in resistance need not be determined as a broken connection within the component. A warning message about a possible defect may also be emitted.

In case the mechanical stress on the support elements 10 increases, they may crack. This may be by breaking up the connection between the support elements 10 and the printed wiring board 2 or the integrated circuit, or by breaking of the support elements 10 themselves. In such a case, the resistance between the taps 12, 14 will become very high, such as some kOhm. A threshold value for the resistance may be defined, which determines a broken component. Once the measured resistance reaches this threshold value, it may be interpreted as a broken connection, and an error message may be emitted.

By providing measurements of electrical properties of the support elements 10, the status of the mechanical coupling between printed wiring board 2 and integrated circuit package may be determined. However, it may also be possible, even if not depicted, to place strain gauges (not depicted) at the support elements 10. Mechanical stress on the support elements 10 causes a change in the mechanical properties, being measured by said strain gauges. This measurement may also be used for determining the mechanical properties of the connection between the printed wiring board 2 and the integrated circuit.

As the support elements are arranged spatially close to the electrical coupling elements, as will be depicted in FIG. 2, the property of the mechanical coupling may be used to determine the status of the electrical coupling. Thus, electrical properties of the electrical coupling between the printed wiring board 2 and the integrated circuit package may be determined and failures may be detected easily.

Figure 2A:
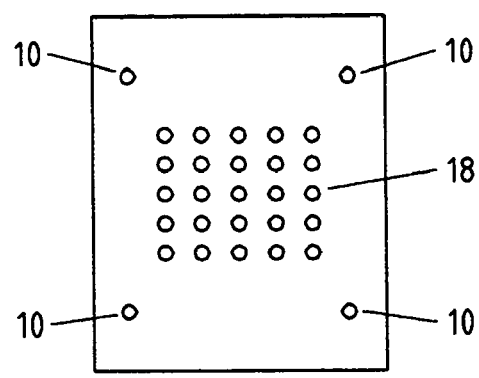
FIG. 2a–c support ball configurations.

FIG. 2a depicts a bottom view of an integrated circuit package, having a ball grid array 18 comprising a plurality of solder balls, each allowing electrically connecting the printed wiring board with the integrated circuit package. Also depicted are support elements 10, which are located at the corners of the integrated circuit package. By locating the support elements 10 at the corners of the integrated circuit package, mechanical stress on the ball grid array may be detected through detecting a change in mechanical properties of the support elements 10.

Figure 2B:
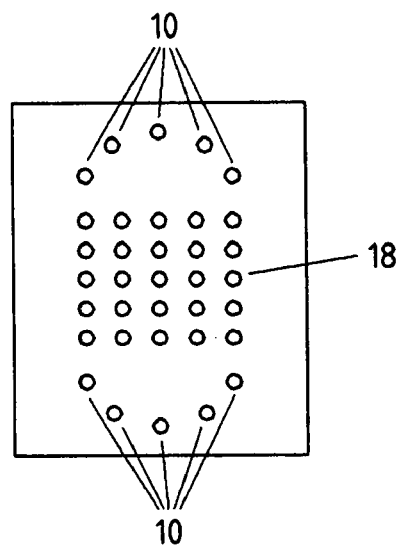

FIG. 2b depicts a further arrangement of a ball grid array 18 and support elements 10. As depicted in FIG. 2b, the ball grid array 18 is embraced by a semicircular arrangement of support elements 10 on either side. This arrangement also allows detecting failures in the electrical coupling of the ball grid array 18 by detecting changes in the mechanical properties of the support elements 10.

Figure 2C:
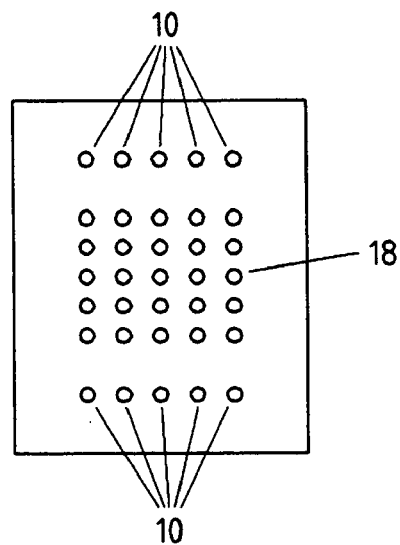

FIG. 2c depicts a further arrangement of the ball grid array 18 and the support elements 10. As depicted in FIG. 2c, the support elements 10 are arranged into rows, embracing the ball grid array 18.

Figure 3:
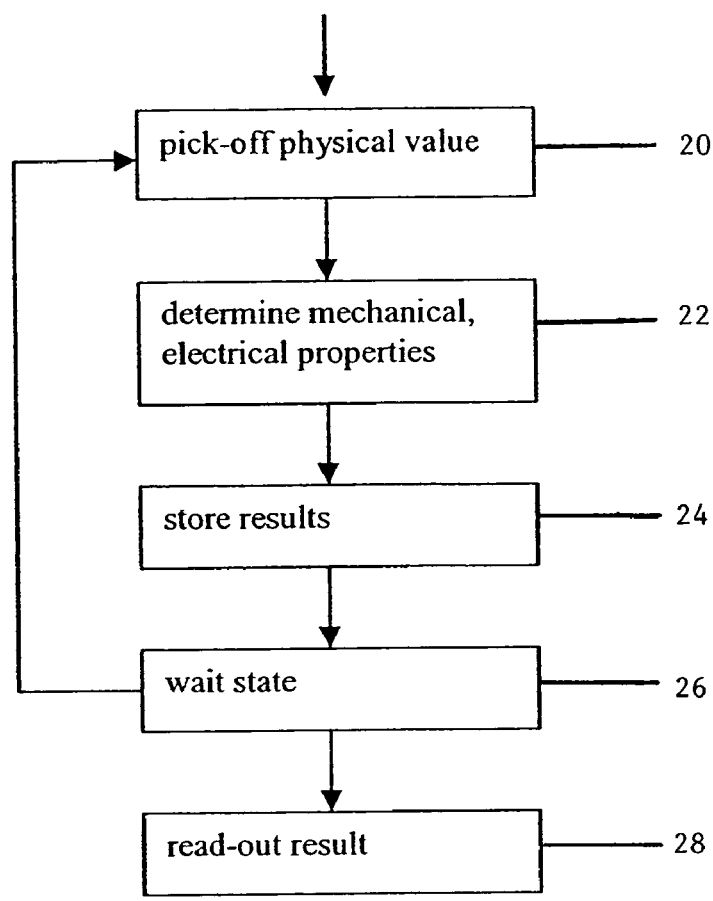
FIG. 3 an inventive method.

FIG. 3 depicts a method according to the invention. First of all, physical values are picked-off from the support elements (step 20). After having picked-off the physical values (step 20), the values are analyzed within a measurement circuit and a status of the mechanical properties of the mechanical coupling between the integrated circuit package and the printed wiring board is determined (step 22). From the status of the mechanical coupling, the status of the electrical coupling is also determined (step 22).

The resulting status is stored in a storage within the respective device (step 24). After that, a wait state is reached (step 26). After a predetermined time, physical values are again picked-off (20). By that, the physical values are picked-off (step 20) in intervals, the electrical coupling properties are determined (step 22) and the results are stored (step 24).

To allow maintenance and repair of the electrical device, the storage may be read out (step 28) through an interface by a technician. By that, the technician may figure out which components are subject to failure and may only replace these components. This reduces repair costs dramatically.

Figure 4:
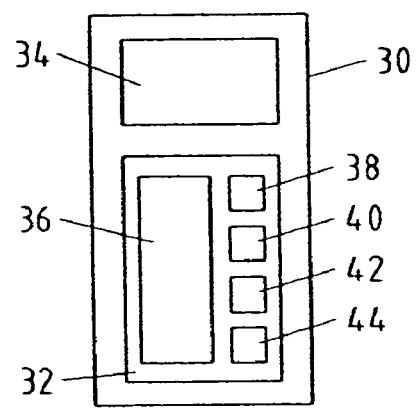
FIG. 4 an inventive mobile phone.

FIG. 4 depicts a mobile phone 30 comprising a system 32 according to the invention and a display 34.

The system 32 comprises a plurality of integrated circuits 36. This plurality of integrated circuits 36 comprises integrated circuit packages which may be monitored according to the invention.

Therefore, at least some of the integrated circuits are connected to a measurement device 38, picking-off physical values from the respective support elements. The measurement device 38 provides the results of the physical values to a determination device 40.

Determination device 40 determines from the physical values the status of the mechanical coupling and thus also the status of the electrical coupling of the connected integrated circuits 36 with the printed wiring board. The results from the determination device 40 are stored in a storage 42.

In case determination device 40 determines an error state, an error message may be generated, whereupon within display 34 an error message may be displayed, prompting a user to bring the mobile phone 30 to a local workshop for needed actions. To allow easy failure analysis, an interface 44 is providing, enabling a technician to read out the stored results from storage 42. By reading out the stored results, the components which are subject to failure may be determined quickly and failure analysis is simplified. Only necessary components, which are actually subject to failure need to be replaced.

Table 1

REFERENCE NUMBERS:

2 printed wiring board
4 substrate
6 die
8 mold
10 support element
12 tap
14 tap
16 wire
18 ball grid array
20 pick-off physical value
22 determine mechanical, electrical properties
24 store results
26 wait state
28 read-out result
30 mobile phone
32 system
34 display
36 ICs
38 measurement device
40 determination device
42 storage
44 interface

What is claimed is:

1. A mobile phone comprising:
a system for analysing connection conditions between an integrated circuit package within said mobile phone and a circuit board within said mobile phone, said system comprising:
coupling elements coupling said integrated circuit package electrically to said circuit board, and
support elements directly connecting said integrated circuit package mechanically with said circuit board using solder balls,
conductors configured to electrically connect at least two of said support elements with each other on the side of the integrated circuit package,
a measurement device arranged at said support elements and configured to pick-off physical values between said support elements, and
a determination device configured to evaluate said physical values to determine mechanical properties of said support elements, and configured to conclude a condition of said electrical coupling of said integrated circuit package with said circuit board from said determined mechanical properties of said support elements.

2. The mobile phone of claim 1, wherein said support elements are arranged between said circuit board and said integrated circuit package.

3. The mobile phone of claim 1, wherein said support elements are solder pads.

4. The mobile phone of claim 1, wherein said support elements are arranged adjacent to said coupling elements.

5. The mobile phone of claim 1, wherein said support elements are arranged semicircular along said coupling elements.

6. The mobile phone of claim 1, wherein said support elements are arranged along edges and/or at corners of said integrated circuit package.

7. The mobile phone of claim 1, wherein said integrated circuit package is a chip scale package or a chip size package.

8. The mobile phone claim 1, wherein said measurement device provides picking-off electrical conditions of said support elements.

9. The mobile phone claim 1, wherein said measurement device provides picking-off mechanical conditions of said support elements.

10. The mobile phone of claim 1, wherein a storage stores said picked-off physical values.

11. The mobile phone of claim 1, wherein said determination device compares said picked-off physical values with comparative values to determine connection condition.

12. The mobile phone of claim 1, wherein said determination device provides an error message in case a poor connection condition is determined.

13. The mobile phone of claim 1, wherein said error message is stored within said storage.

14. The mobile phone of claim 1, wherein an interface is provided to read out said stored physical values and/or stored error messages.

15. An apparatus comprising:
coupling elements coupling an integrated circuit package electrically to a circuit board,
support elements directly connecting said integrated circuit package mechanically with said circuit board using solder balls,
conductors configured to electrically connect at least two of said support elements with each other on the side of the integrated circuit package,
a measurement device arranged at said support elements and configured to pick-off physical values between said support elements, and
a determination device configured to evaluate said physical values to determine mechanical properties of said support elements, and configured to conclude a condition of said electrical coupling of said integrated circuit package with said circuit board from said determined mechanical properties of said support elements.

16. The system of claim 15, wherein said support elements are arranged semicircular along said coupling elements.

17. The apparatus of claim 15, wherein said support elements are arranged along edges and/or at corners of said integrated circuit package.

18. An apparatus comprising:
coupling elements coupling an integrated circuit package electrically to a circuit board, and
support elements directly connecting said integrated circuit package mechanically with said circuit board using solder balls,
means for electrically connecting at least two of said support elements with each other on the side of the integrated circuit package,
measuring means arranged at said support elements for picking off physical values between said support elements, and
evaluation means for evaluating said physical values to determine mechanical properties of said support elements, and for concluding a condition of said electrical coupling of said integrated circuit package with said circuit board from said determined mechanical properties of said support elements.

19. The apparatus of claim 18, wherein said support elements are arranged semicircular along said coupling elements.

* * * * *

UNITED STATES PATENT AND TRADEMARK OFFICE
CERTIFICATE OF CORRECTION

PATENT NO. : 7,211,995 B2  Page 1 of 1
APPLICATION NO. : 10/814855
DATED : May 1, 2007
INVENTOR(S) : Hannu Ventomaki It is certified that error appears in the above-identified patent and that said Letters Patent is hereby corrected as shown below:

At column 8, line 1, claim 8, line 1, please insert --of-- after the word "phone".

At column 8, line 4, claim 9, line 1, please insert --of-- after the word "phone".

Signed and Sealed this

Seventh Day of August, 2007

JON W. DUDAS
*Director of the United States Patent and Trademark Office*